(12) United States Patent
Kishiume et al.

(10) Patent No.: US 9,719,164 B2
(45) Date of Patent: Aug. 1, 2017

(54) METHOD OF MANUFACTURING COMPOUND FILM

(71) Applicant: NIKON CORPORATION, Tokyo (JP)

(72) Inventors: Tsukasa Kishiume, Kawasaki (JP); Koichiro Iwahori, Fuchu (JP)

(73) Assignee: NIKON CORPORATION, Tokyo (JP)

(*) Notice: Subject to any disclaimer, the term of this patent is extended or adjusted under 35 U.S.C. 154(b) by 0 days.

(21) Appl. No.: 14/926,710

(22) Filed: Oct. 29, 2015

(65) Prior Publication Data

US 2016/0060747 A1 Mar. 3, 2016

Related U.S. Application Data

(63) Continuation of application No. PCT/JP2014/002365, filed on Apr. 28, 2014.

(30) Foreign Application Priority Data

May 15, 2013 (JP) .................. 2013-103280

(51) Int. Cl.
  *C23C 14/06* (2006.01)
  *H01L 21/02* (2006.01)
  (Continued)

(52) U.S. Cl.
  CPC ...... *C23C 14/0676* (2013.01); *C23C 14/0641* (2013.01); *C23C 14/08* (2013.01); *C23C 14/083* (2013.01); *C23C 14/325* (2013.01); *C23C 14/34* (2013.01); *H01L 21/02381* (2013.01); *H01L 21/02422* (2013.01); *H01L 21/02483* (2013.01); *H01L 21/02491* (2013.01);
  (Continued)

(58) Field of Classification Search
  USPC ......... 428/698, 701; 204/192, 192.1, 192.12, 204/192.15, 192.38
  See application file for complete search history.

(56) References Cited

U.S. PATENT DOCUMENTS

| 2011/0140367 A1 | 6/2011 | Shi |
| 2011/0177460 A1 | 7/2011 | Shi |
| 2011/0186420 A1 | 8/2011 | Shi |

FOREIGN PATENT DOCUMENTS

| CN | 101602272 A | 12/2009 |
| JP | 60-187671 | 9/1985 |

(Continued)

OTHER PUBLICATIONS

Okada et al "Fabrication of photocatalytic heat-mirror with TiO2/TiN/TiO2 stacked layers" Vacuum 80 (2006) p. 732-735.*

(Continued)

*Primary Examiner* — Archene Turner

(57) ABSTRACT

An amount of nitrogen in a compound film is controlled. A method of manufacturing compound film comprising forming films laminated on a substrate placed at a film forming chamber is provided. According to the method of manufacturing compound film, a first compound layer including one or more elements selected from metal elements and semi-metal elements and oxygen element and a second compound layer including one or more elements and nitrogen element are laminated alternately. The first compound layer is formed by a Filtered Arc Ion Plating method and the second compound layer is formed by a sputtering method.

8 Claims, 11 Drawing Sheets

(51) Int. Cl.
C23C 14/08 (2006.01)
C23C 14/32 (2006.01)
C23C 14/34 (2006.01)

(52) U.S. Cl.
CPC .. *H01L 21/02507* (2013.01); *H01L 21/02565* (2013.01); *H01L 21/02631* (2013.01)

(56) References Cited

FOREIGN PATENT DOCUMENTS

| JP | 63-190742 | * | 8/1988 |
| JP | 63-252944 | * | 10/1988 |
| JP | 2000-140636 | | 5/2000 |
| JP | 2011-522964 | | 8/2011 |

OTHER PUBLICATIONS

PCT International Written Opinion of the International Searching Authority dated Jul. 29, 2014 in corresponding International Patent Application No. PCT/JP2014/002365.
PCT International Preliminary Report on Patentability dated Nov. 26, 2015 in corresponding International Patent Application No. PCT/JP2014/002365.
International Search Report mailed Jul. 29, 2014 in corresponding international application PCT/JP2014/002365.
S.H. Mohamed et al., "Effect of Heat Treatment on Structural, Optical and Mechanical Properties of Sputtered $TiO_xN_y$ films", Elsevier: Thin Solid Films, May 10, 2004, pp. 48-56.
Wan et al., "Anatase $TiO_2$ films with 2.2 eV band gap prepared by micro-arc oxidation", Materials Science and Engineering: B, vol. 139, Issue 2-3, 1 page, 2007.
Chunling, "Chapter 5: Preparation and Characterization of Multi-Layer Film; 5.1 Preparation and Characterization of $TiO_2$/Tin Bilayer Film", Engineering Technique, vol. 3, Series 2, China Excellent Doctor Master Degree Paper Full-Text Database (Master), 2 pages (with translation), 2004.
Shengge et al., "Research of Properties of Cr+Ti+TINC/TINC+C/DLC Films Prepared by Composite Ion Plating Technique", Nuclear Technology, vol. 31, Section 2, 2 pages (with translation), 2008.
Chinese Office Action dated Aug. 1, 2016 in corresponding Chinese Patent Application No. 201480012651.0.
Chinese Office Action dated Mar. 2, 2017 in corresponding Chinese Patent Application No. 201480012651.0.

* cited by examiner

METHOD OF MANUFACTURING COMPOUND FILM

The contents of the following Japanese and PCT patent applications are incorporated herein by reference:
No. 2013-103280 filed on May 15, 2013, and
PCT/JP2014/002365 filed on Apr. 28, 2014.

BACKGROUND

1. Technical Field

The present invention is related to a method of manufacturing a compound film.

2. Related Art

Conventionally, a titanium oxynitride film has been manufactured by a sputtering method (for example, refer to Patent Document 1).
Patent Document 1: Japanese Patent Application Publication No. 2000-140636

SUMMARY

A method of forming a single-layer oxynitride film is present as a method of forming a metal or semimetal oxynitride film. Also, there is a method of forming an oxynitride film by laminating oxide layers and nitride layers alternately, too. For example, for forming a film of titanium oxynitride, a method of forming a single-layer titanium oxynitride film is present. Further, there is also a method of forming a titanium oxynitride film by laminating titanium oxide layers and titanium nitride layers alternately.

When forming a single-layer titanium oxynitride film, usually, one of the following film forming methods is adopted: a vacuum deposition method, a sputtering method, an ion plating method and the like. However, a bonding between oxygen and titanium is thermal-chemically stable than a bonding between nitrogen and titanium. Therefore, when forming a single-layer titanium oxynitride film, nitrogen is hardly taken into a titanium oxynitride film, comparing with oxygen. Accordingly, it is difficult to control an amount of nitrogen in a titanium oxynitride film optionally, and it is difficult to control a size of a bandgap of a titanium oxynitride film optionally.

Also, when forming a titanium oxynitride film by laminating titanium oxide layers and titanium nitride layers alternately, an atomic layer deposition method is considered to be used. However, since a bonding between oxygen and titanium is thermal-chemically stable than a bonding between nitrogen and titanium, when forming the titanium oxide layer, nitrogen in a titanium nitride layer is substituted by oxygen easily. Consequently, nitrogen is hardly taken into the titanium oxynitride film, comparing with oxygen. Therefore, it is difficult to control an amount of nitrogen in a titanium oxynitride film optionally, and it is difficult to control a size of a bandgap of a titanium oxynitride film optionally.

A first aspect of the present invention provides a method of manufacturing compound film comprising forming a compound film on a substrate placed at a film forming chamber. The method of manufacturing compound film comprises laminating a first compound layer and a second compound layer alternately on a substrate, wherein the first compound layer includes one or more elements selected from metal elements and semimetal elements and oxygen element and is formed by a filtered arc ion plating method, and the second compound layer includes one or more of the elements and nitrogen element and is formed by a sputtering method.

A second aspect of the present invention provides a compound film formed on a substrate, wherein the compound film includes titanium, oxygen and nitrogen, and a bandgap is equal to 1.0 eV or more and is equal to 3.1 eV or less.

Further, the above-described summary clause does not necessarily describe all necessary features of the present invention. Also, any sub-combination of the groups of features described above can also be the present invention.

DESCRIPTION OF EXEMPLARY EMBODIMENTS

Hereinafter, some embodiments of the present invention will be described. Embodiments described below do not limit the invention according to the claims. Also, all the combinations of the features described in the embodiments are not necessarily essential to means provided by aspects of the invention.

Figure 1:
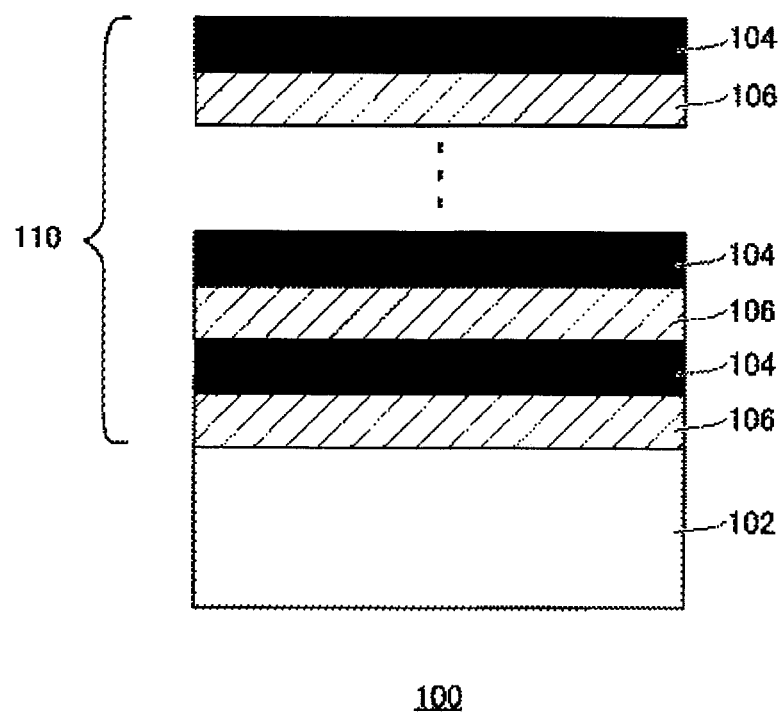
FIG. 1 is a graph showing a cross section of a film-formed article according to a first embodiment.

FIG. 1 is a graph showing a cross section of a film-formed article 100 according to a first embodiment. The film-formed article 100 includes a substrate 102 and a compound film 110. As for the compound film 110, a titanium oxide layer 104 as a first compound layer and a titanium nitride layer 106 as a second compound layer are laminated on a substrate 102 alternately. In the example, the substrate 102 is a silicon substrate. Also, the substrate 102 might be a quartz substrate, alumina substrate, a SiC substrate, a GaAs substrate, a metal substrate, a resin substrate or the like. Further, a lamination order of the first compound layer and the second compound layer in the compound film 110 is conceptually described in FIG. 1; however, it does not indicate that there is a clear interface between the first compound layer and the second compound layer.

The first compound layer includes one or more elements selected from metal elements and semimetal elements and oxygen element. Also, the second compound layer includes one or more elements selected from metal elements and semimetal elements and nitrogen element. The metal elements are, for example, titanium, zirconium, hafnium, niobium, zinc or aluminum. Also, the semimetal elements are, for example, silicon or germanium. In the example, since titanium is selected as the metal element, the first compound layer is a titanium oxide layer 104 and the second compound layer is a titanium nitride layer 106. Further, although the titanium oxide layer in this specification indicates a layer including oxygen and titanium as main constituent elements, other elements such as nitrogen and the like might be included as constituent elements. Also, although the titanium nitride layer indicates a layer including nitrogen and titanium as main constituent elements, other elements such as oxygen and the like might be included as constituent elements. In other words, the titanium oxide layer indicates a layer in which a proportion of oxygen is relatively higher than that in the titanium nitride layer. The titanium nitride layer indicates a layer in which a proportion of nitrogen is higher than that in the titanium oxide layer. In the example, the titanium oxide layer corresponds to a layer formed on a film forming condition that the layer comprising titanium oxide is formed when forming a single-layer film. The titanium nitride layer corresponds to a layer formed on a film forming condition that the layer comprising titanium nitride is formed when forming a single-layer film. The titanium oxynitride film indicates a film including oxygen, nitrogen and titanium as constituent elements.

Figure 2:
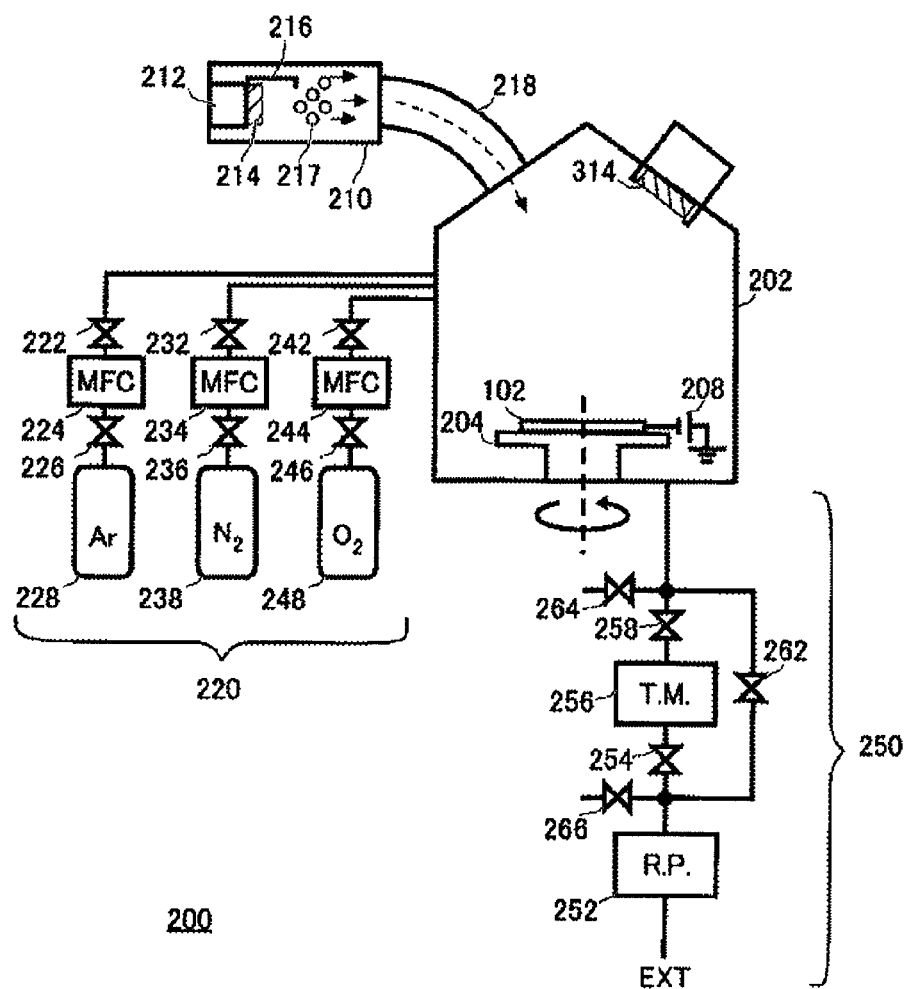
FIG. 2 is a graph showing a film-forming apparatus for forming the film-formed article according to the first embodiment.

FIG. 2 is a graph showing a film forming apparatus 200 for forming the film-formed article 100 according to the first embodiment. The film forming apparatus 200 comprises a film forming chamber 202, an ion generation section 210, an electromagnetic filter 218, a gas supplying section 220 and a vacuum suction mechanism 250. Further, the ion generation section 210 and the electromagnetic filter 218 configure a Filtered Arc Ion Plating (FAIP, hereinafter) section.

The film forming chamber 202 is a vacuum container for film forming the compound film 110 on the substrate 102. A substrate holder 204 is installed at a bottom in a gravity direction of the film forming chamber 202. The substrate 102 is installed to the substrate holder 204. Also, the electromagnetic filter 218 is installed at an upper portion in the gravity direction of the film forming chamber 202. Also, a target 314 used in sputtering is installed on an inner wall of the upper portion in the gravity direction of the film forming chamber 202.

Further, a load-lock chamber might be connected to the film forming chamber 202. The film forming chamber 202 can be kept in a vacuum state always by using the load-lock chamber when putting the substrate 102 in and out. Consequently, it can eliminate a possibility that unintended impurities mix into a thin film.

The substrate holder 204 holds the substrate 102 in a process of forming the compound film 110. Further, the substrate 102 might be held by the substrate holder 204 in a state that its surface where the titanium oxide layer 104 and the titanium nitride layer 106 are grown is downward in the gravity direction. In this case, the substrate holder 204 is installed at the upper portion in the gravity direction of the film forming chamber 202. Also, in this case, the electromagnetic filter 218 and the target 314 are installed at the bottom in the gravity direction of the film forming chamber 202.

The substrate holder 204 comprises a rotary drive mechanism. The substrate 102 is rotated around a center of the substrate holder 204 as a rotary shaft by using the rotary drive mechanism. Comparing with a non-rotation case, the compound film 110 can be formed uniformly on all over the surface of the substrate 102 by rotating the substrate 102.

The substrate holder 204 comprises a substrate heating mechanism. The substrate 102 is heated by the substrate heating mechanism. By the heating, a thermal diffusion of atoms in each compound layer can be enhanced in the process of forming the titanium oxide layer 104 or the titanium nitride layer 106 on the substrate 102. Comparing with a case that the substrate 102 is not heated, uniformities in configurations of the titanium oxide layer 104 and the titanium nitride layer 106 and thicknesses on all over the surface of the substrate 102 can be improved by enhancing the thermal diffusion.

A voltage source 208 applies a bias voltage to the substrate 102. In the example, a direct-current voltage source is used as the voltage source 208. Further, the voltage source 208 might be an alternating current voltage source. However, when an applying voltage value is excessively high, a reverse sputter to the substrate 102 is induced in some cases. When the reverse sputter is induced to the substrate 102, the uniformities of the configurations of the titanium oxide layer 104 and the titanium nitride layer 106 and the thicknesses deteriorate. Consequently, the bias voltage value of the voltage source 208 is preferable to be set to a voltage value which does not induce the reverse sputter. In the example, the bias voltage value of the voltage source 208 is in a range from 0 V to −200 V.

The ion generation section 210 at least comprises a cathode 212, a target 214 and a trigger 216. The cathode 212 is installed at the ion generation section 210. The target 214 is fixed to the cathode 212. The trigger 216 is installed in the vicinity of the target 214. Also, the trigger 216 is connected to a trigger drive mechanism. By using the trigger drive mechanism, the trigger 216 can contact a surface of the target 214 which is opposite to the cathode 212 and can separate from the surface.

At the ion generation section 210, a distance between the trigger 216 and the target 214 and a current amount from the trigger 216 to the target 214 can be controlled and particles 217 are generated from the target 214. At first, while the trigger 216 contacts the surface of the target 214 on the opposite side of the cathode 212, a current is sent to the trigger 216. Next, the trigger 216 is pulled apart from the target 214. Accordingly, an arc discharge is generated between the target 214 and the trigger 216. According to the arc discharge, the particles 217 in various states such as metal or semimetal ions, neutral atoms, clusters, microparticles and the like are generated from the target 214.

In the example, the target 214 is a material including titanium. Therefore, the particles 217 generated at the ion generation section 210 are, for example, particles 217 of titanium ion. The particles 217 of titanium ion generated from the target 214 proceed to the electromagnetic filter 218 from the ion generation section 210.

The electromagnetic filter 218 is installed between the film forming chamber 202 and the ion generation section 210. The electromagnetic filter 218 comprises a curved hollow path inside. Further, a wire is provided in proximity to an outer portion of the electromagnetic filter 218. A magnetic field along the hollow path can be applied by sending currents through the wire.

Also, by adjusting intensity of the magnetic field, particles 217 having constant electric charge and mass among the particles 217 pass through the electromagnetic filter 218. Therefore, the particles 217 having constant electric charge and mass can be sorted by using the electromagnetic filter 218. Accordingly, the compound film 110 can be formed by using the sorted particles 217. In this way, a compound film 110 having uniform properties all over inner side of the compound film 110 and having a high grade can be formed.

The gas supplying section 220 comprises valves 222, 226, 232, 236, 242 and 246, mass flow controllers 224, 234 and 244 and gas containers 228, 238 and 248. On/off of a gas flow is controlled by the valves 222, 226, 232, 236, 242 and 246. Also, a flow rate of the gas is controlled by the mass flow controllers 224, 234 and 244.

The valves 222 and 226, the mass flow controller 224 and the gas container 228 configure a supply system of sputtering gas. A flow rate of the sputtering gas is controlled to be in a range from 0 sccm to 500 sccm by the mass flow controller 224. The mass flow controller 224 controls the flow rate of the sputtering gas per unit time in accordance with an external control signal. In the example, an argon gas is used as the sputtering gas.

The valves 232 and 236, the mass flow controller 234 and the gas container 238 configure a supply system of nitriding gas which is a reactive gas. A flow rate of the nitriding gas is controlled to be in a range from 0 sccm to 200 sccm by the mass flow controller 234. The mass flow controller 234 controls the flow rate of the nitriding gas per unit time in accordance with an external control signal. The nitriding gas is a reactive gas which comprises molecules including nitrogen atom. For example, the nitriding gas is a reactive gas comprising nitrogen or ammonia molecule. In the example, a nitrogen gas is used as the nitriding gas.

The valves 242 and 246, the mass flow controller 244 and the gas container 248 configure a supply system of oxidizing gas which is a reactive gas. A flow rate of the oxidizing gas is controlled to be in a range from 0 sccm to 200 sccm by the mass flow controller 244. The mass flow controller 244 controls the flow rate of the oxidizing gas per unit time in accordance with an external control signal. The oxidizing gas is a reactive gas which comprises molecules including oxygen atom. For example, the oxidizing gas is a reactive gas comprising oxygen, ozone and water. In the example, oxygen gas is used as the oxidizing gas.

The vacuum suction mechanism 250 comprises a rotary pump 252, a turbo molecular pump 256, valves 254, 258 and 262 and leak valves 264 and 266. The vacuum suction mechanism 250 controls a vacuum degree in the film forming chamber 202. In an initial stage of vacuum suction, the valve 262 is opened and it carries out vacuum suction of the inside of the film forming chamber 202 roughly by using the rotary pump 252. After a prescribed vacuum degree is reached, the valve 262 is closed and the valve 254 and the valve 258 are opened. Then, it further carries out vacuum suction of the inside of the film forming chamber 202 by using the turbo molecular pump 256. Accordingly, the vacuum degree in the film forming chamber 202 can be the prescribed one. Further, the leak valves 264 and 266 are used for making the film forming chamber 202 be in an atmosphere pressure.

Figure 3:
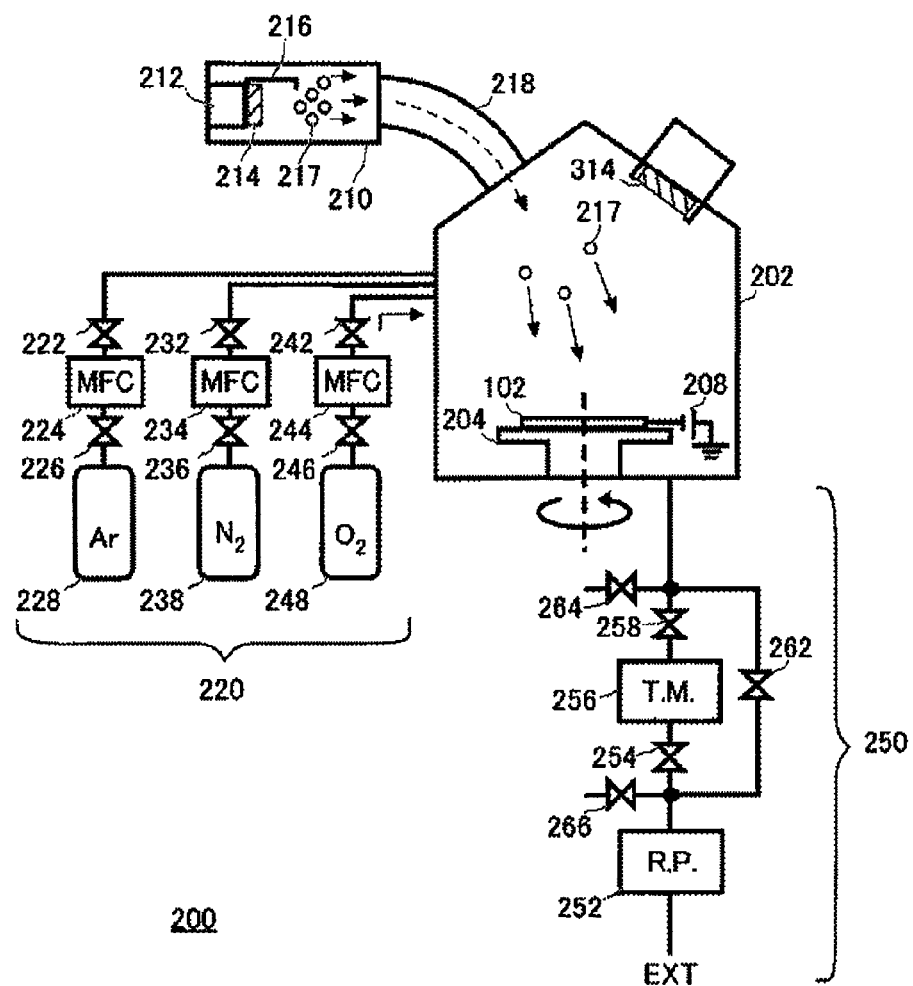
FIG. 3 is a graph showing a method of forming a first compound layer according to the first embodiment.

FIG. 3 is a graph showing a method of forming the titanium oxide layer 104 according to the first embodiment. In the example, the titanium oxide layer 104 is formed by using the film forming apparatus 200 according to a FAIP method. Further, in the present specification, the FAIP method indicates a method of performing film forming by using the FAIP section and generating ions. The FAIP section at least comprises the ion generation section 210 which comprises the cathode 212, the target 214 and the trigger 216 and the electromagnetic filter 218 which sorts ions by the magnetic field.

For performing the FAIP method, after the film forming chamber 202 is in a vacuum state, the valve 242 and the valve 246 are opened and then oxygen gas is introduced from the gas container 248 into the film forming chamber 202 while controlling the flow rate by the mass flow controller 244.

Then, the titanium ion generated in the ion generation section 210 and sorted by the electromagnetic filter 218 is introduced into the film forming chamber 202. The titanium ion introduced into the film forming chamber 202 acts with the oxygen gas. Accordingly, the oxygen gas is in a strong reactive state. For example, the oxygen becomes oxygen ion. Further, the strong reactive state includes an ionic state and a radical state. The titanium ion reacts with the oxygen ion which is in a strong reactive state and becomes titanium oxide. The titanium oxide is deposited on the substrate 102 and becomes the titanium oxide layer 104.

Figure 4:
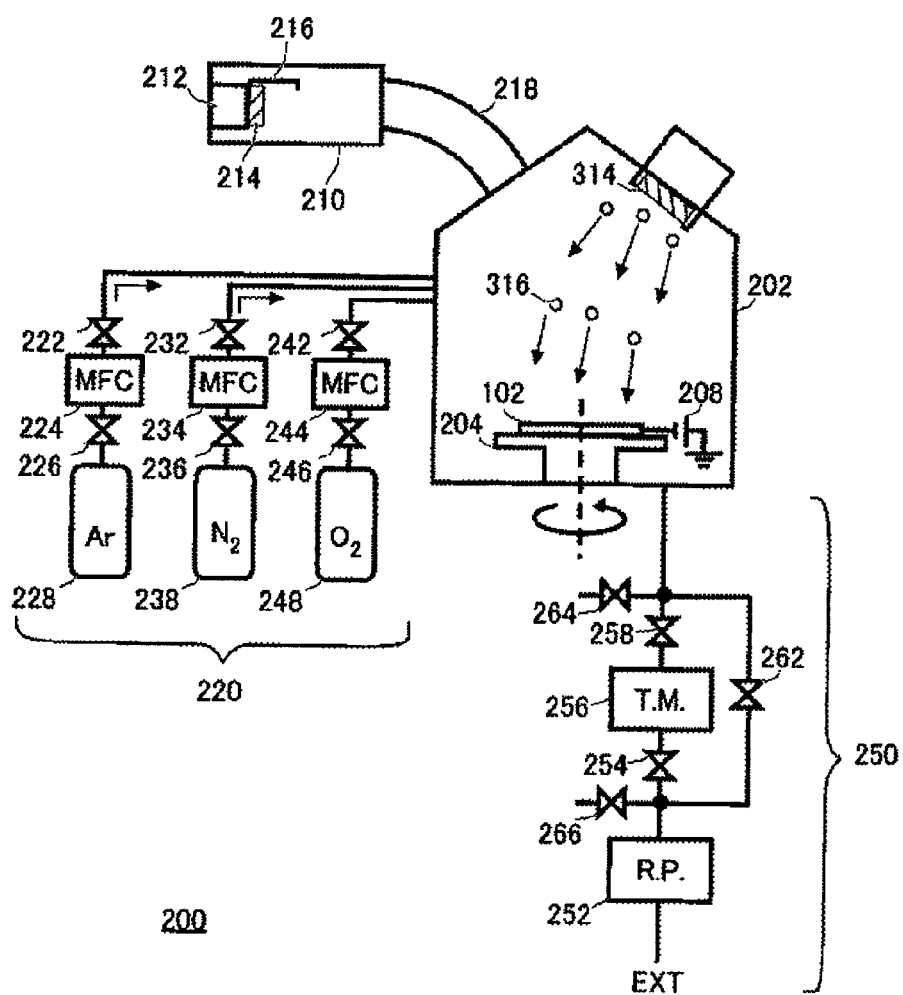
FIG. 4 is a graph showing a method of forming a second compound layer according to the first embodiment.

FIG. 4 is a graph showing a method of forming the titanium nitride layer 106 according to the first embodiment. In the example, the titanium nitride layer 106 is formed by using the film forming apparatus 200 according to the sputtering method. Further, in the present specification, the sputtering method indicates a method of performing film forming by applying a negative bias to the target 314 in the film forming chamber 202 and then sputtering the target 314 by the gas supplied into the film forming chamber 202. Further, the negative bias might be applied by either of a direct-current power supply or an alternating current power supply.

For performing the sputtering method, at first, the film forming chamber 202 is evacuated to a vacuum state. Then, the argon gas and the nitrogen gas are introduced into the film forming chamber 202. The valve 222 and the valve 226 are opened and then the argon gas is introduced from the gas container 248 into the film forming chamber 202 while controlling the flow rate by the mass flow controller 224. Similarly, the valve 232 and the valve 236 are opened and then the nitrogen gas is introduced from the gas container 238 into the film forming chamber 202 while controlling the flow rate by the mass flow controller 234.

Next, a potential difference is formed inside the film forming chamber 202. For forming the potential difference, for example, the film forming chamber 202 is grounded and the negative bias is applied to the target 314. A glow discharge occurs between the film forming chamber 202 and the target 314 due to the potential difference formed between the film forming chamber 202 and the target 314. The argon gas and the nitrogen gas are dissociated by the glow discharge from the target 314 and are in a strong reactive state in the film forming chamber 202.

For example, the argon gas becomes argon ion and the nitrogen gas becomes nitrogen ion. The argon ion is accelerated toward the target 314 and sputters titanium atom of the target 314. A particle 316 of the titanium atom sputtered by the argon ion scatters toward the substrate 102. The particle 316 of the titanium atom reacts with the nitrogen ion and becomes titanium nitride during the scattering process. The titanium nitride is deposited on the substrate 102 and becomes the titanium nitride layer 106.

On the substrate 102 placed at the film forming chamber 202, the compound film 110 is formed by laminating alternately the titanium oxide layer 104 formed according to the FAIP method and the titanium nitride layer 106 formed according to the sputtering method. Further, a pressure in the film forming chamber 202 when forming the titanium oxide layer 104 is less than a pressure in the film forming chamber 202 when forming the titanium nitride layer 106. In the example, the pressure in the film forming chamber 202 when forming the titanium oxide layer 104 according to the FAIP method is approximately 0.2 Pa. Also, the pressure in the film forming chamber 202 when forming the titanium nitride layer 106 according to the sputtering method is approximately 1.3 Pa.

Figure 5:
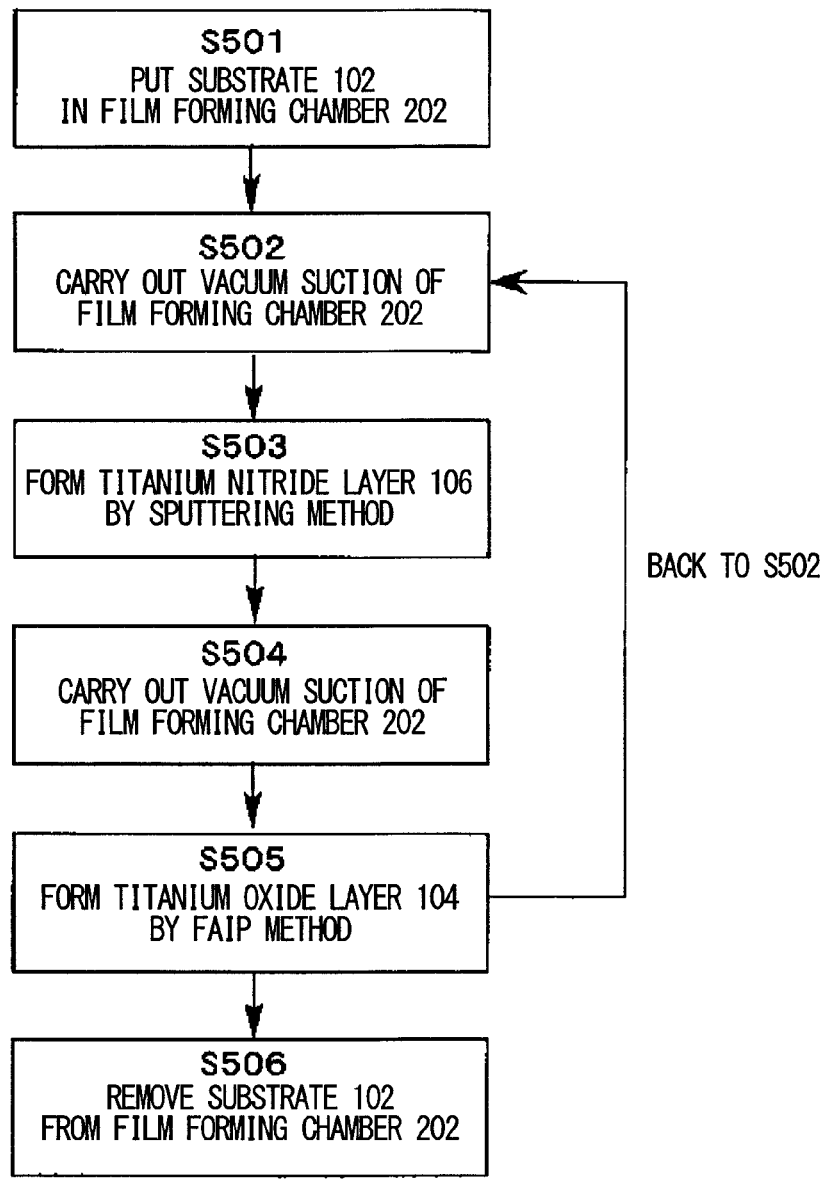
FIG. 5 is a graph showing a flow of forming the film-formed article according to the first embodiment.

FIG. 5 is a graph showing a flow of forming the film-formed article 100 according to the first embodiment. In a step S501, the substrate 102 is conveyed into the film forming chamber 202. After the step S501, it carries out vacuum suction of the inside of the film forming chamber 202 in a step S502. According to the vacuum suction, impurities excluding gas types which are objects are nearly eliminated. After the step S502, the titanium nitride layer 106 is formed according to the sputtering method on the substrate 102 in a step S503. After the step S503, it carries out vacuum suction of the inside of the film forming chamber 202 in a step S504. Accordingly, nitrogen, argon, titanium, titanium nitride and particles of titanium nitride and the like are eliminated from the film forming chamber 202. After the step S504, the titanium oxide layer 104 is formed according to the FAIP method in a step S505.

After the step S505, it returns to the step S502 and the steps from S502 to S505 are repeated. In the example, the steps from S502 to S 505 are repeated for ten times. Accordingly, the titanium oxide layers 104 and the titanium nitride layers 106 are formed alternately each in ten layers. After the steps from S502 to S505 are repeated for ten times, the substrate 102 is removed from the film forming chamber 202 in a step S506.

Example 1

The compound film 110 was formed by laminating the titanium oxide layer 104 and the titanium nitride layer 106 alternately by using the film forming apparatus 200. In the example, the titanium oxide layer 104 was formed according to the FAIP method and the titanium nitride layer 106 was formed according to the sputtering method. Synthetic quartz glass wafer and silicon wafer were used in the substrate 102. In other words, a sample forming the compound film 110 on the synthetic quartz glass wafer and a sample forming the compound film 110 on the silicon wafer were formed at the same time.

Materials including titanium having a purity of 99.9% were used in each of the target 214 and the target 314. Further, oxygen gas, nitrogen gas and argon gas were used as each of oxidizing gas, nitriding gas and sputtering gas.

At first, the synthetic quartz glass wafer and the silicon wafer as the substrate 102 were placed at the substrate holder 204 respectively. Then, it carried out vacuum suction of the film forming chamber 202 by using the vacuum suction mechanism 250. According to the vacuum suction, the pressure in the film forming chamber 202 became 1*10−4 Pa or less. Also, the substrate holder 204 was rotated during forming the compound film 110. Further, a bias voltage of −100 V was applied to the synthetic quartz glass wafer and the silicon wafer by using the voltage source 208.

For forming the titanium nitride layer 106, the argon gas at a flow rate of 10 sccm and the nitrogen gas at a flow rate of 3 sccm were introduced into the film forming chamber 202. Also, a high frequency wave power supply of 13.56 MHz supplied a power of 500 W to the target 314 and the glow discharge was generated in the film forming chamber 202. After the power was supplied for 34 seconds, the power supply to the target 314, the supply of the nitrogen gas and the argon gas to the film forming chamber 202, the bias voltage application to the synthetic quartz glass wafer and the silicon wafer and the rotation of the substrate holder 204 were stopped respectively. The pressure in the film forming chamber 202 when film forming was approximately 1.3 Pa. Further, when a titanium nitride single-layer film was formed on a substrate on the same condition, a film thickness of the titanium nitride single-layer film formed for 34 seconds was approximately 1 nm. Hereafter, a film thickness of each layer configuring laminated films is represented in accordance with the thickness of the single-layer film when film forming the single-layer films on the substrate on the same condition.

Next, as a preparation for forming the titanium oxide layer 104, it carried out vacuum suction of the inside of the film forming chamber 202 by using the vacuum suction mechanism 250. According to the vacuum suction, the pressure in the film forming chamber 202 became 1*10−4 Pa or less. After that, the substrate holder 204 was rotated. Also, a current of 120 A was applied to the trigger 216 and the arc discharge was generated on the target 214. Synchronized to beginning of the discharge, the oxygen gas at a flow rate of 50 sccm was introduced into the film forming chamber 202. After the current was applied to the trigger 216 for 80 seconds, the rotation of the substrate holder 204, the current application to the trigger 216 and the introduction of the oxygen gas were stopped. A film thickness of the titanium oxide layer 104 formed for 80 seconds is approximately 9 nm. Further, the pressure in the film forming chamber 202 when film forming was approximately 0.2 Pa.

Next, it carried out vacuum suction of the film forming chamber 202 to form the titanium nitride layer 106 contacting the titanium oxide layer 104. According to the vacuum suction, the pressure in the film forming chamber 202 was 1*10−4 Pa or less.

The formation of the titanium nitride layer 106 and the formation of the titanium oxide layer 104 described above were repeated alternately. The titanium nitride layer 106 and the titanium oxide layer 104 were formed each in ten layers and were laminated in twenty layers totally. A film thickness of the formed compound film 110 was 101 nm as a measurement result by using a stylus type step profiler.

Further, a composition of the compound film 110 was analyzed by a Rutherford Back Scattering (RBS, hereafter) method. As for each compound film 110 of the two samples of the synthetic quartz glass wafer and the silicon wafer, ratios of average number of atoms of oxygen atom, nitrogen atom and argon atom to titanium atom were measured. As a result, the ratio of average number of atoms of the oxygen atom to the titanium atom (O/Ti) was 1.76. The ratio of average number of atoms of the nitrogen atom to the titanium atom (N/Ti) was 0.16. The ratio of average number of atoms of the argon atom to the titanium atom (Ar/Ti) was 0.01.

Also, a reflectivity and a permeability of the compound film 110 were measured. An absorption coefficient was calculated according to the measurement result and a band-gap (an optical band gap) of the compound film 110 was determined by a Tauc plot. The bandgap of the compound film 110 of the sample of the synthetic quartz glass wafer was 3.05 eV.

A First Comparative Example

As a first comparative example, the titanium oxide layer 104 was formed according to the sputtering method and the titanium nitride layer 106 was formed according to the FAIP method, and then the compound film 110 was formed by laminating the titanium oxide layer 104 and the titanium nitride layer 106 alternately. In other words, comparing with the example 1, the methods for forming the titanium oxide layer 104 and the titanium nitride layer 106 were reverse.

When forming the titanium nitride layer 106 by using the FAIP method, conditions such as the vacuum suction, the rotation of the substrate 102 and the like are the same as the above-described example 1. However, the bias voltage was not applied to the substrate 102. Also, when forming the titanium nitride layer 106, the flow rate of the nitrogen gas was 10 sccm. The formation of the titanium nitride layer 106 by the FAIP method was performed for 5 seconds. The film thickness of the titanium nitride layer 106 formed for the 5 seconds was approximately 1 nm.

When forming the titanium oxide layer 104 by using the sputtering method, conditions such as the vacuum suction, the rotation of the substrate 102 and the like were the same as the above-described example 1. However, the bias voltage was not applied to the substrate 102. Also, when forming the titanium oxide layer 104, the flow rate of the argon gas was 10 sccm and the flow rate of the oxygen gas was 3 sccm. The formation of the titanium oxide layer 104 by the sputtering method was performed for 964 seconds. The film thickness of the titanium oxide layer 104 formed for the 964 seconds was approximately 9 nm.

The formation of the titanium oxide layer 104 and the formation of the titanium nitride layer 106 described above were repeated alternately. The film thickness of the formed compound film 110 was 78 nm, as a measurement result by using the stylus type step profiler. Also, the composition of the compound film 110 was analyzed by the RBS method. As a result, the ratio of average number of atoms of the oxygen atom to the titanium atom (O/Ti) was 1.99. The ratio of average number of atoms of the nitrogen atom to the titanium atom (N/Ti) was equal or less than 0.06 which was a lower limit of detection. The ratio of average number of atoms of the argon atom to the titanium atom (Ar/Ti) was 0.004. That is, a content of the nitrogen is half of that of the example 1 or less.

A Second Comparative Example

As a second comparative example, the titanium oxide layer 104 and the titanium nitride layer 106 were formed individually by the FAIP method, and then the compound film 110 was formed by laminating the titanium oxide layer 104 and the titanium nitride layer 106 alternately. In other words, in the second comparative example, the particles 217 of the titanium ion were supplied from the ion generation section 210 and the oxygen gas and the nitrogen gas as a supplying gas were supplied alternately into the film forming chamber 202.

When forming the titanium nitride layer 106 by using the FAIP method, conditions such as the vacuum suction and the rotation of the substrate 102 were the same as the above-described example 1. However, the bias voltage was not applied to the substrate 102. Also, when forming the titanium nitride layer 106, the flow rate of the nitrogen gas was 10 sccm. The formation of the titanium nitride layer 106 by the FAIP method was performed for 5 seconds. The film thickness of the titanium nitride layer 106 formed for the 5 seconds was approximately 1 nm.

When forming the titanium oxide layer 104 by using the FAIP method, conditions such as the vacuum suction, the rotation of the substrate 102 and the like were the same as the above-described example 1. However, the bias voltage is not applied to the substrate 102. Also, when forming the titanium oxide layer 104, the flow rate of the oxygen gas was 50 sccm. The formation of the titanium oxide layer 104 according to the FAIP method was performed for 80 seconds. When a titanium oxide single-layer film is formed on a substrate on the same condition, a film thickness of titanium oxide film formed for 80 seconds is approximately 9 nm.

The formation of the titanium oxide layer 104 and the formation of the titanium nitride layer 106 described above were repeated alternately. The thickness of the formed compound film 110 was measured by using the stylus type step profiler. As a result, the film thickness was 78 nm. Also, a composition of the compound film 110 was analyzed by the RBS method. The ratio of average number of atoms of the oxygen atom to the titanium atom (O/Ti) was 1.78. The ratio of average number of atoms of the nitrogen atom to the titanium atom (N/Ti) was equal or less than 0.06 which was a lower limit of detection. In other words, a content of the nitrogen was half of that of the example 1 or less.

As shown in the ratio of average number of atoms (N/Ti) of the compound film 110 in the example 1, when forming the titanium oxide layer 104 by the FAIP method and forming the titanium nitride layer 106 by the sputtering method, the nitrogen could be clearly residual in the compound film 110. However, when forming the titanium oxide layer 104 by the sputtering method and forming the titanium nitride layer 106 by the FAIP method as the first comparative example and when forming both the titanium oxide layer 104 and the titanium nitride layer 106 by the FAIP method as the second comparative example, it was difficult to have the nitrogen residual in the compound film 110.

As one factor influencing the residual nitrogen amount of the compound film 110, a difference between the pressure in the film forming chamber 202 when forming the titanium nitride layer 106 and the pressure in the film forming chamber 202 when forming the titanium oxide layer 104 is considered. As described above, in the example 1, the titanium oxide layer 104 is formed by the FAIP method in an atmosphere having a pressure of approximately 0.2 Pa and the titanium nitride layer 106 is formed by the sputtering method in an atmosphere having a pressure of approximately 1.3 Pa. Since the pressure when forming the titanium nitride layer 106 by using the sputtering method is higher than the pressure when forming the titanium oxide layer 104 by using the FAIP method, the ions including the nitrogen such as the nitrogen ion, the titanium nitride and the like have larger energy than the ions including the oxygen. Consequently, it is considered that the nitrogen or the titanium nitride is substituted to the oxygen or the titanium oxide of the titanium oxide layer 104 and an initial layer of the titanium nitride is formed. Then, it is considered that once the initial layer of the titanium nitride covering the titanium oxide layer 104 is formed, the titanium nitride layer is formed stably.

On the other hand, as the first and second comparative examples, when forming the titanium nitride layer 106 on the titanium oxide layer 104 by using the FAIP method which is in an atmosphere having a lower pressure than the sputtering method, it is considered that the substitution reaction of the ions including the nitrogen and the oxygen of the titanium oxide layer 104 does not progress. Consequently, it is considered that even the titanium ion was supplied from the ion generation section 210 to the film forming chamber 202 and the nitrogen gas was supplied to the film forming chamber 202, the titanium nitride layer 106 is not formed. In the stage of forming the titanium nitride layer 106 according to the first and the second comparative examples, it is considered that the titanium nitride layer 106 on the titanium oxide layer 104 is difficult to be formed. Further, in the stage for forming the titanium nitride layer 106, it is considered that the titanium atom is introduced into the titanium oxide layer 104 formed before and the titanium oxide layer 104 grew. However, since the amount of the titanium atom which can be introduced into the titanium oxide layer 104 formed before is limited, it is considered that the growth of the titanium oxide layer saturated instantly. Consequently, it is considered that even the titanium oxide layers 104 and the titanium nitride layers 106 were laminated alternately each in ten layers as the example 1, the difference of 23 nm between the thicknesses of the compound films 110 eventually formed generated.

Figure 6:
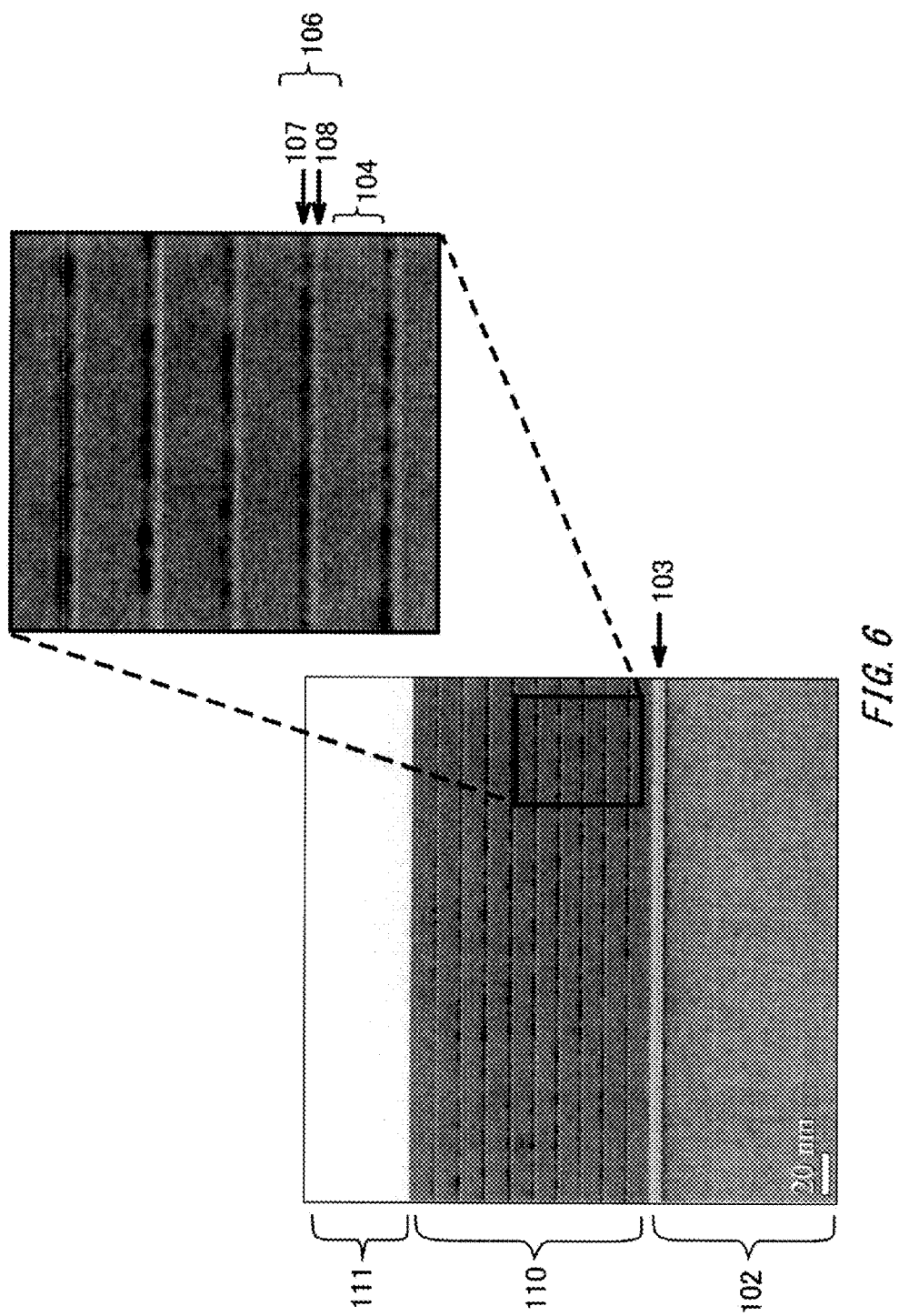
FIG. 6 is a graph showing a cross section of a compound film formed according to an example 1, observed by using a scanning transmission type electron microscope (STEM).

FIG. 6 is a graph showing a cross section of the compound film 110 formed according to the example 1, observed by using the Scanning Transmission Type Electron Microscope. A silicon oxide layer 103 being a natural oxide film is formed on a surface of the silicon wafer as the substrate 102.

In the compound film 110, the titanium nitride layer 106 having a thickness of approximately 4.5 nm and the titanium oxide layer 104 having a thickness of approximately 7.5 nm are laminated as a constituent unit. Further, a passivation layer 111 including carbon as a main component is formed as a top layer.

The titanium nitride layer 106 comprises a low-contrast amorphous layer 107 which has a thickness of approximately 2.0 nm and a high-contrast microcrystal layer 108 which has a thickness of approximately 2.5 nm and is formed neighboring the amorphous layer 107.

The titanium oxide layers 104 and the titanium nitride layers 106 are laminated alternately each in ten layers. Also, the compound film 110 is laminated homogeneously in a vertical direction of a page space and in a plane direction of the film.

Figure 7:
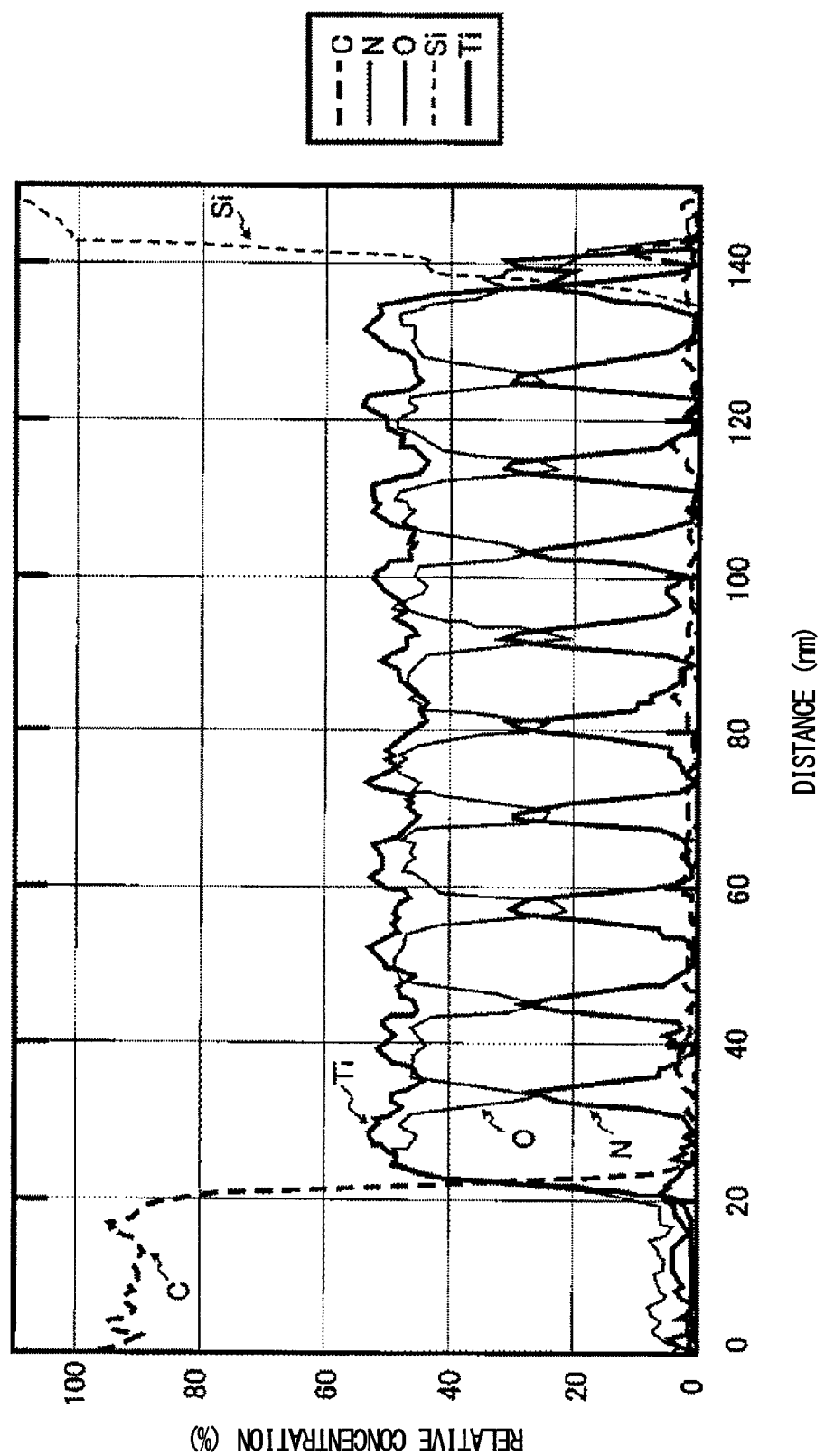
FIG. 7 is a graph showing a result of an element distribution of the compound film formed according to the example 1 measured by an electron energy loss spectroscopic method (EELS method).

FIG. 7 is a graph showing a measurement result of an element distribution of the compound film 110 formed according to the example 1 by an Electron Energy Loss Spectroscopic method (EELS method). A surface on an opposite side to the substrate 102 of the compound film 110 formed according to the example 1 was a zero point. In other words, the uppermost surface of the passivation layer 111 was the zero point. Further, a distance from the zero point in a thickness direction of the substrate 102 was presented in a horizontal axis. A vertical axis represents a relative concentration of each element in the compound film 110 formed according to the example 1. Carbon and silicon are indicated by dotted lines, nitrogen and titanium are indicated by bold lines, and further, oxygen is indicated by a thin line.

According to the example 1, the titanium oxide layer 104 was formed in approximately 9 nm and the titanium nitride layer 106 was formed in approximately 1 nm. Consequently, the periodical structure is reflected and a concentration peak of the nitrogen element and a concentration peak of the oxygen element are present alternately each for ten times between a distance from 20 nm to 140 nm. At a position where the nitrogen element is in a maximum value, the concentration of the oxygen element being in a minimum value is the same as the concentration of the nitrogen element. In other words, in the titanium nitride layer 106, the concentration of the nitrogen is the same as the concentration of the oxygen.

Figure 8:
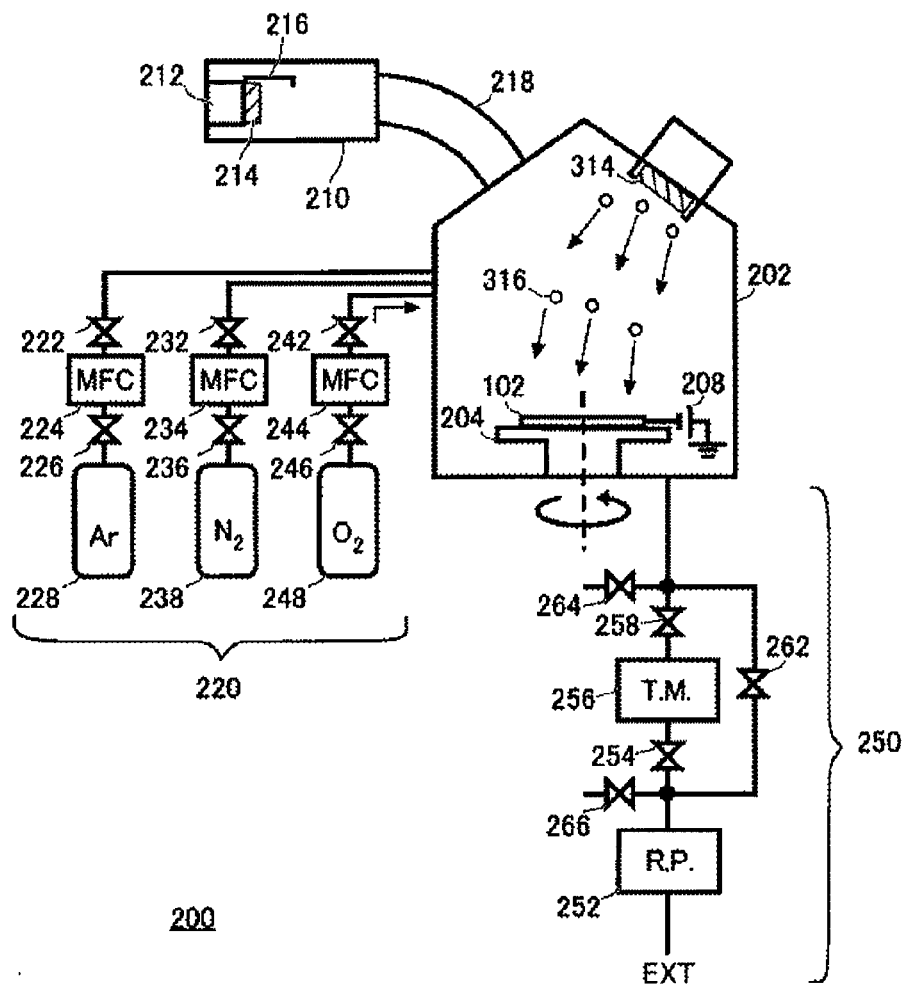
FIG. 8 is a graph showing another example method of forming the first compound layer.

FIG. 8 is a graph showing another example method of forming the titanium oxide layer 104. In a second embodiment, the titanium oxide layer 104 as the first compound layer and the titanium nitride layer 106 as the second compound layer are both formed by the sputtering method. However, considering a principle that the above-described nitrogen is introduced into the compound film 110, the pressure in the film forming chamber 202 when forming the titanium oxide layer 104 is lower than the pressure in the film forming chamber 202 when forming the titanium nitride layer 106. For example, the pressure in the film forming chamber 202 when forming the titanium nitride layer 106 might be about 1.3 Pa. Also, the pressure in the film forming chamber 202 when forming the titanium oxide layer 104 might be a minimum pressure in which plasma including oxygen ion and the like can be generated between the substrate 102 and the target 314.

The method of forming titanium nitride layer 106 is the same as the example 1. The argon gas and the oxidizing gas are introduced into the film forming chamber 202 for forming the titanium oxide layer 104. The argon gas and the oxidizing gas dissociate by the glow discharge of the target 314 and are present in a strong reactive state in the film forming chamber 202.

The argon ion in a strong reactive state sputters the titanium atom of the target 314. The particle 316 of the sputtered titanium ion scatters toward the substrate 102. The particle 316 of the titanium ion is oxidized by, for example, the oxygen ion, before reaching the substrate 102. Then, the titanium oxide layer 104 is formed on the substrate 102.

In the example, the amount of the nitrogen atom in the compound film 110 can be controlled without combining the FAIP method and the sputtering method Therefore, the apparatus configuration is simple. However, from a point of view of high-precision control of the nitrogen amount in the compound film 110, it is considered that forming the titanium oxide layer 104 by the FAIP method and the titanium nitride layer 106 by the sputtering method is superior than forming both of them by the sputtering method only.

The minimum pressure in the film forming chamber 202 in which the plasma including the oxygen ion and the like can be generated according to the sputtering method is generally higher than the pressure in the film forming chamber 202 when forming the titanium oxide according to the FAIP method. Also, a speed of forming the titanium oxide layer 104 on the substrate 102 according to the sputtering method is generally slower than a speed of forming the titanium oxide layer 104 on the substrate 102 according to the FAIP method. Therefore, when forming the titanium oxide layer by the sputtering method, a possibility that the nitrogen atom in the titanium nitride layer 106 is substituted to the oxygen atom becomes higher than when forming the titanium oxide by the FAIP method. Consequently, it is considered that the amount of the nitrogen atom in the compound film 110 when forming the titanium oxide by the FAIP method is easier to control than by the sputtering method.

Figure 9:
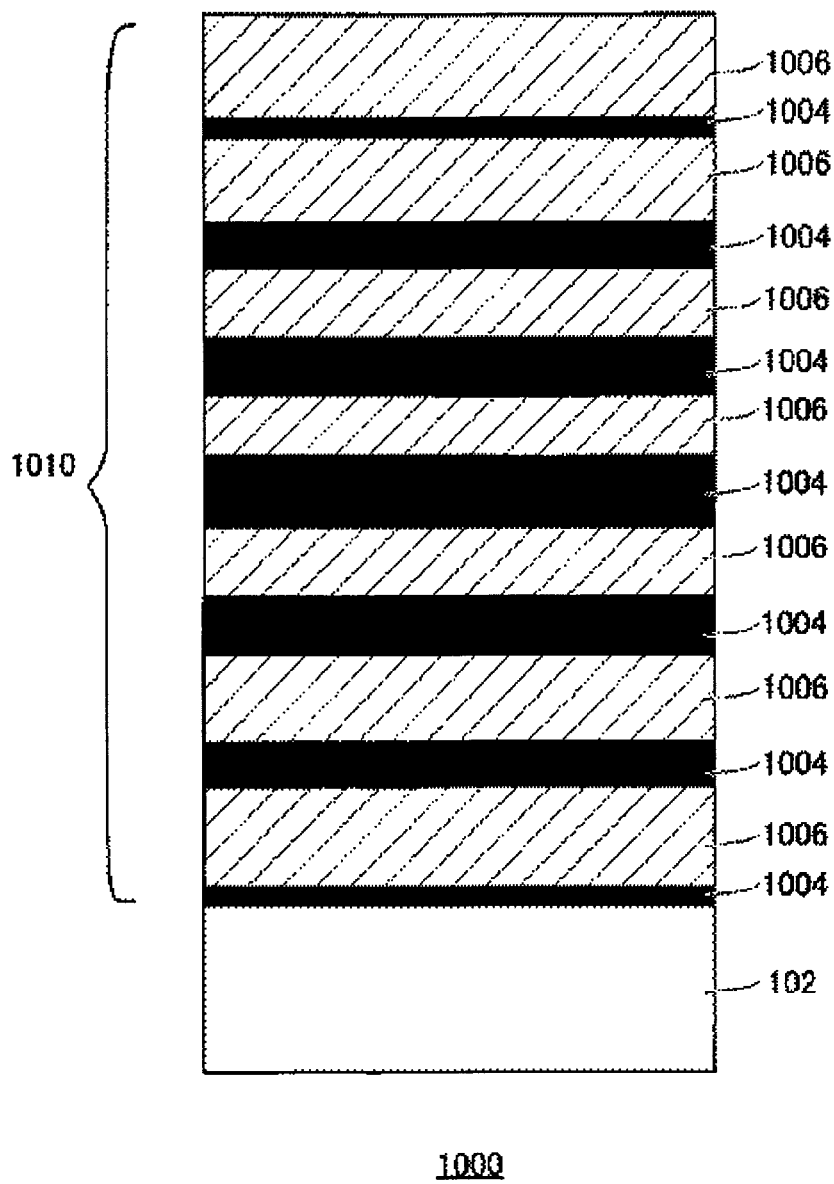
FIG. 9 is a graph showing a cross section of a film-formed article according to a second embodiment.

FIG. 9 is a graph showing a cross section of a film-formed article 1000 according to the second embodiment. In the example, a ratio of a thickness of a titanium oxide layer 1004 being a first compound layer to a thickness of a titanium nitride layer 1006 being a second compound layer laminated alternately on the substrate 102 is changed and the ratio is different from that in the first embodiment. Further, similar to the FIG. 1, a lamination order of the first compound layer and the second compound layer and sizes of relative film thicknesses are conceptually described in FIG. 9; however, it does not indicate that there is a clear interface between the first compound layer and the second compound layer.

By controlling a forming time of the titanium oxide layer 1004 and the forming time of the titanium nitride layer 1006 respectively, a proportion of oxygen and a proportion of nitrogen in a compound film 1010 are controlled. Further, in the present specification, the proportion of oxygen indicates a number of atoms of the oxygen element with regards to a number of atoms of one or more metal or semimetal elements such as titanium and the like included in the compound film 1010. Also, the proportion of nitrogen indicates a number of atoms of the nitrogen element with regards to a number of atoms of one or more of the elements included in the compound film 1010.

In the example, the thickness of each layer is controlled to be in a range from 1 nm to 10 nm by controlling the forming time of each layer. Specifically, the film forming times are adjusted so that the ratios of film thicknesses of the titanium oxide layer 1004 to the titanium nitride layer 1006 ([the film thickness of the titanium oxide layer 1004: the film thickness of the titanium nitride layer 1006]) become [1:6], [2:5], [3:4], [5:5], [3:4], [2:5] and [1:6] in an order from a position near the substrate 102.

Accordingly, the proportion of oxygen can be higher in the vicinity of the substrate 102 and in the vicinity of a surface on an opposite side of the substrate 102 of the compound film 1010. On the other hand, the proportion of nitrogen can be higher in the vicinity of a film thickness center of the compound film 1010. Therefore, the compound film 1010 comprising different properties in the surface and inside of the compound film 1010 can be formed.

Figure 10:
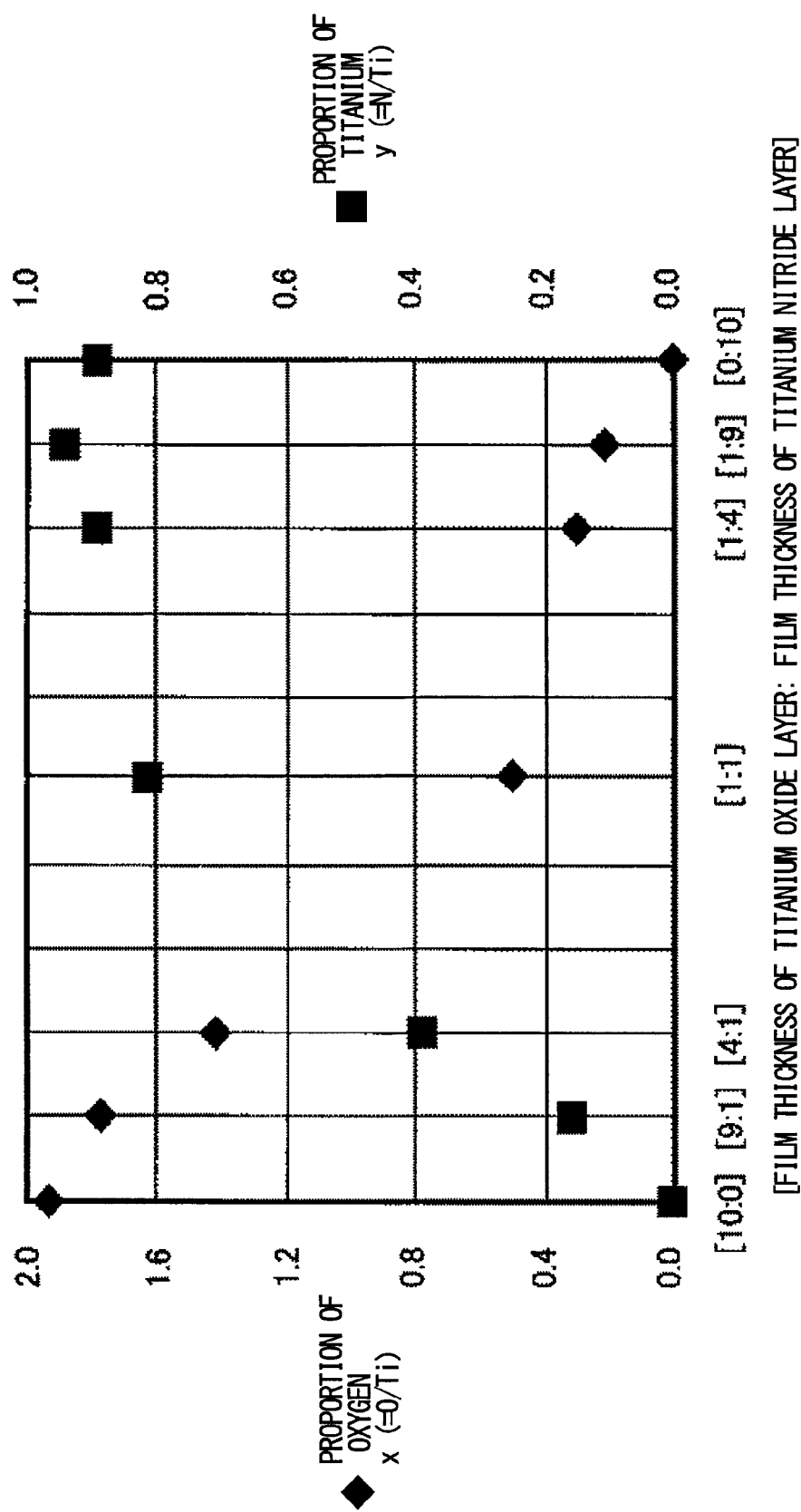
FIG. 10 is a graph showing a proportion of oxygen (x) and a proportion of nitrogen (y) in samples having different ratios of film thickness of a titanium oxide layer to that of a titanium nitride layer.

FIG. 10 is a graph showing the proportion of oxygen (x) and the proportion of nitrogen (y) in samples having different ratios of the film thickness of the titanium oxide layers to the titanium nitride layers. The horizontal axis indicates the ratio of the film thickness of the titanium nitride layer to the film thickness of the titanium oxide layer. For example, in a case of [4:1], the film thickness of the titanium oxide layer is four times of the film thickness of the titanium nitride layer. The vertical axis on the left side indicates the proportion of oxygen (x) and the vertical axis on the right side indicates the proportion of nitrogen (y). Further, the proportion of oxygen (x) and the proportion of nitrogen (y) are a measurement result of a ratio of average number of atoms of the entire compound film. The ratio of average number of atoms was estimated by the RBS method.

The film forming times were adjusted so that the ratios of the film thickness of the titanium oxide layer to the film thickness of the titanium nitride layer became [10:0], [9:1], [4:1], [1:1], [1:4], [1:9], [0:10]. At the samples having different ratios of the film thickness of the titanium oxide layer to the film thickness of the titanium nitride layer, the proportion of oxygen and the proportion of nitrogen changed relatively to each film thickness.

Further, according to the first embodiment, the ratio of the thickness of the titanium oxide layer 104 to the thickness of the titanium nitride layer 106 was approximately [9:1]. The data is reflected as a second data from the left of FIG. 10. The proportion of oxygen (x) and the proportion of nitrogen (y) at [9:1] of the horizontal axis are approximately 1.76 and 0.16.

In the example, the proportion of oxygen was controlled to be in a range larger than zero and equal or less than 2.0. Also, the proportion of nitrogen is controlled to be in a range larger than zero and equal or less than 1.0. In other words, the proportion of nitrogen in the compound film can be controlled with high precision by changing the ratio of the thickness of the titanium oxide layer being the first compound layer to the thickness of the titanium nitride layer being the second compound layer.

Figure 11:
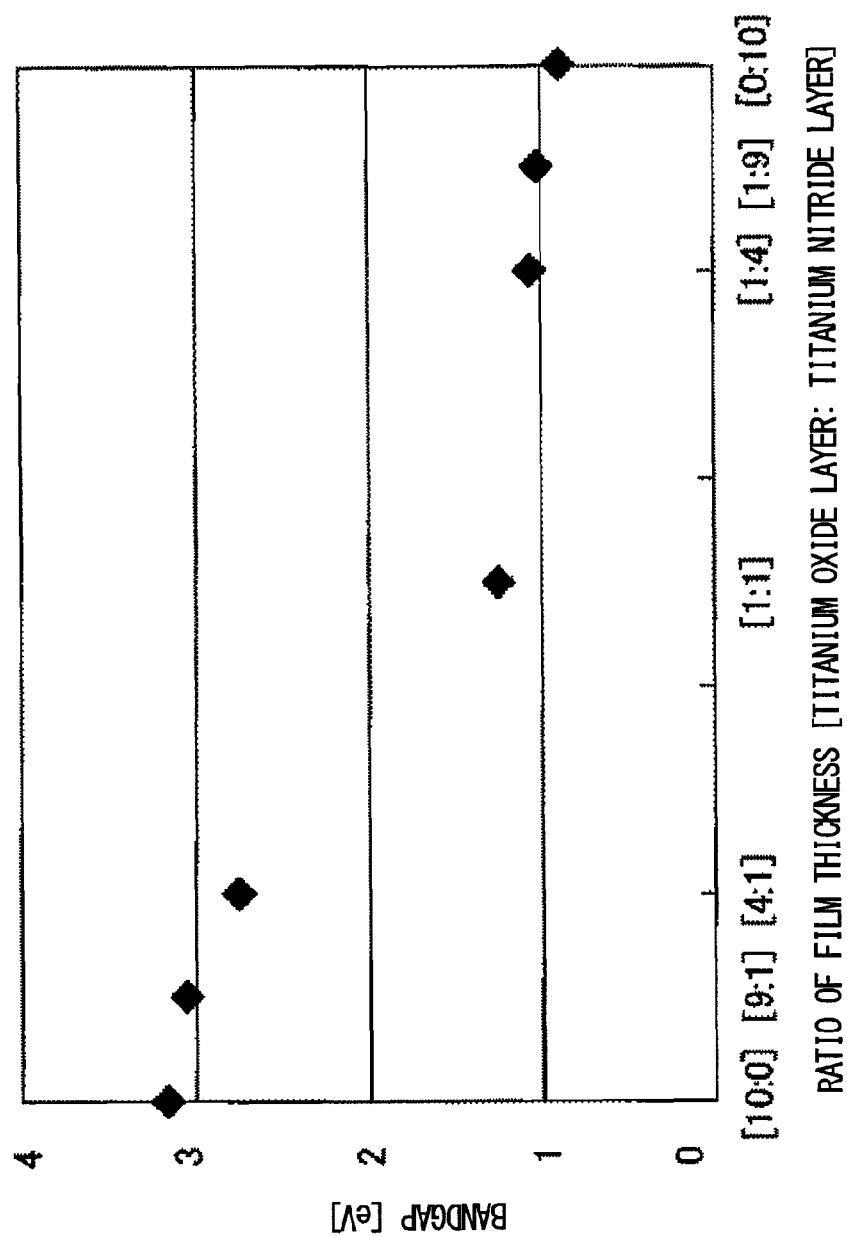
FIG. 11 is a graph showing a bandgap of the samples having different ratios of film thickness of the titanium oxide layer to that of the titanium nitride layer.

FIG. 11 is a graph showing a bandgap of the samples having different ratios of the film thickness of the titanium oxide layer to the titanium nitride layer. The horizontal axis indicates the ratios of the film thickness of the titanium nitride layer to the film thickness of the titanium oxide layer. The vertical axis indicates the bandgap [eV] of each sample. The bandgap was estimated by measuring a reflectivity and a permeability of the entire compound film, calculating an absorption coefficient from the measured result and then using the TAUTSU plot.

The film forming times were adjusted so that the ratios of the film thickness of the titanium oxide layer to the film thickness of the titanium nitride layer became [10:0], [9:1], [4:1], [1:1], [1:4], [1:9], [0:10]. In other words, the ratio of the film thickness of the titanium oxide layer to the film thickness of the titanium nitride layer was changed per sample, and then the first compound layer including the titanium oxide formed by the FAIP method and the second compound layer including the titanium nitride formed by the sputtering method were formed alternately on the substrate. At the samples having different ratios of the film thickness of the titanium oxide layer to the film thickness of the titanium nitride layer, the bandgap changed relatively to each film thickness.

In a case that the ratio of the thickness of the titanium oxide layer 104 to the thickness of the titanium nitride layer 106 is approximately [1:9], the bandgap is 1.0 eV. Further, according to the first embodiment, the ratio of the thickness of the titanium oxide layer 104 to the thickness of the titanium nitride layer 106 was approximately [9:1]. The data is reflected as a second data from the left of FIG. 11. The bandgap at [9:1] of the horizontal axis is 3.05 eV.

In the example, the bandgap of the titanium oxynitride film was controlled to be in any value between the bandgap of the titanium oxide film and the bandgap of the titanium nitride. In other words, by changing the thickness ratio of the thickness of the titanium oxide layer being the first compound layer to the thickness of the titanium nitride layer being the second compound layer, the bandgap of the entire compound film could be controlled. In the example, the bandgap of the titanium oxynitride film could be equal or larger than 1.0 eV and equal or smaller than 3.1 eV.

As above, while the embodiments of the present invention have been described, the technical scope of the present invention is not limited to the above-described embodiments. It is apparent to persons skilled in the art that various alterations and improvements can be added to the above-described embodiments. It is also apparent from the scope of the claims that the embodiments added with such alterations or improvements can be included in the technical scope of the present invention.

The operations, procedures, steps and stages of each process performed by an apparatus, system, program and method shown in the claims, embodiments or diagrams can be performed in any order as long as the order is not indicated by "prior to", "before" or the like and as long as the output from a previous process is not used in a later process. Even if the process flow is described using phrases such as "first" or "next" in the claims, embodiments or diagrams, it does not necessarily mean that the process must be performed in this order.

What is claimed is:

1. A method of manufacturing a compound film on a substrate placed in a film forming chamber, the method comprising:
   forming on the substrate, by a Filtered Arc Ion Plating method, a first compound layer including oxygen and one or more elements selected from the group consisting of metal elements and semimetal elements; and
   forming on the substrate, by a sputtering method, a second compound layer including nitrogen and one or more elements selected from the group consisting of metal elements and semimetal elements.

2. The method of claim 1, wherein
   a pressure in the film forming chamber when forming the first compound layer is less than a pressure in the film forming chamber when forming the second compound layer.

3. The method of claim 1, further comprising:
   controlling a proportion of oxygen and a proportion of nitrogen by changing a thickness ratio of a thickness of the first compound layer to a thickness of the second compound layer laminated alternately on the substrate, wherein
   the proportion of oxygen is a number of atoms of the oxygen element with regards to a number of atoms of one or more of the elements included in the compound film, and
   the proportion of nitrogen is a number of atoms of the nitrogen element with regards to a number of atoms of one or more of the elements included in the compound film.

4. The method of claim 1, further comprising:
   controlling a ratio of a thickness of the first compound layer to a thickness of the second compound layer such that the proportion of oxygen in the compound film, by number of atoms, is greater than zero and equal to or less than 2.0 and the proportion of nitrogen in the compound film, by number of atoms, is greater than zero and equal to or less than 1.0.

5. The method of claim 1, wherein
   a proportion of oxygen in the first compound layer is higher than that in the second compound layer, and
   a proportion of nitrogen in the second compound layer is higher than that in the first compound layer.

6. The method of claim 1, further comprising:
   alternately repeating the forming of the first compound layer by the Filtered Arc Ion Plating method and the forming of the second compound layer by the sputtering method.

7. A compound film formed on a substrate, the compound film comprising:
   a first compound layer including titanium oxide formed by a Filtered Arc Ion Plating method; and
   a second compound layer including titanium nitride formed by a sputtering method, wherein
   a bandgap of the compound film is equal to or more than 1.0 eV and equal to or less than 3.1 eV.

8. The compound film of claim 7, further comprising:
   a plurality of the first compound layers; and
   a plurality of the second compound layers, wherein
   the first compound layers by the Filtered Arc Ion Plating method and the second compound layers by the sputtering method are alternately formed.

* * * * *